United States Patent
Hu et al.

(10) Patent No.: US 11,664,250 B2
(45) Date of Patent: *May 30, 2023

(54) METHODS AND APPARATUS FOR MEASURING EDGE RING TEMPERATURE

(71) Applicant: APPLIED MATERIALS, INC., Santa Clara, CA (US)

(72) Inventors: Ji-Dih Hu, Sunnyvale, CA (US); Wolfgang R. Aderhold, Sunnyvale, CA (US); Dongming Iu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,461

(22) Filed: Apr. 25, 2022

(65) Prior Publication Data

US 2022/0246453 A1 Aug. 4, 2022

Related U.S. Application Data

(63) Continuation of application No. 16/707,945, filed on Dec. 9, 2019, now Pat. No. 11,342,209.

(51) Int. Cl.
*G01J 5/00* (2022.01)
*H01L 21/00* (2006.01)
(Continued)

(52) U.S. Cl.
CPC ...... *H01L 21/67248* (2013.01); *G01J 5/0802* (2022.01); *G01J 5/0806* (2013.01);
(Continued)

(58) Field of Classification Search
CPC .......... G01J 5/08; G01J 5/0806; G01J 5/0818; G01J 5/0802; H01L 21/67248; H01L 21/67115
(Continued)

(56) References Cited

U.S. PATENT DOCUMENTS

| 5,490,728 A | 2/1996 | Schietinger et al. |
| 5,743,643 A | 4/1998 | Gronet et al. |

(Continued)

FOREIGN PATENT DOCUMENTS

DE 4012615 10/1991

OTHER PUBLICATIONS

International Search Report and Written Opinion for PCT/USUS2020/056772 dated Feb. 9, 2021.
(Continued)

*Primary Examiner* — Mirellys Jagan
(74) *Attorney, Agent, or Firm* — Moser Taboada

(57) ABSTRACT

An apparatus for measuring a temperature of an assembly that is internal to a process chamber. The apparatus may include a light pipe positioned between a lamp radiation filtering window and the assembly, the light pipe has a first end with a bevel configured to redirect infrared radiation emitted from the assembly through the light pipe and has a second end distal to the first end, an optical assembly configured to collimate, filter, and focus infrared radiation from the second end of the light pipe, an optical detector configured to receive an output from the optical assembly and generate at least one signal representative of the infrared radiation, a temperature circuit that transforms the at least one signal into a temperature value, and a controller that is configured to receive the temperature value and to make adjustments to other process parameters of process chamber based on the temperature value.

20 Claims, 7 Drawing Sheets

(51) Int. Cl.
  *H01L 21/67* (2006.01)
  *G01K 7/01* (2006.01)
  *G01J 5/0802* (2022.01)
  *G01J 5/0818* (2022.01)
  *G01J 5/0806* (2022.01)

(52) U.S. Cl.
  CPC .............. *G01J 5/0818* (2013.01); *G01K 7/01* (2013.01); *H01L 21/67115* (2013.01)

(58) Field of Classification Search
  USPC .................. 374/131, 121, 120, 208, 141
  See application file for complete search history.

(56) References Cited

U.S. PATENT DOCUMENTS

| | | |
|---|---|---|
| 5,830,277 A | 11/1998 | Johnsgard et al. |
| 6,133,152 A | 10/2000 | Bierman et al. |
| 7,112,763 B2 | 9/2006 | Hunter et al. |
| 9,403,251 B2 | 8/2016 | Tallavarjula et al. |
| 2007/0020784 A1 | 1/2007 | Timans |
| 2009/0116125 A1 | 5/2009 | Kolesnychenko et al. |
| 2009/0323759 A1 | 12/2009 | Govindaraju et al. |
| 2010/0054720 A1 | 3/2010 | Hunter et al. |
| 2010/0124248 A1 | 5/2010 | Patalay et al. |
| 2015/0050118 A1 | 2/2015 | Sorabji et al. |
| 2015/0131699 A1 | 5/2015 | Aderhold |
| 2015/0168231 A1 | 6/2015 | Koshimizu et al. |

OTHER PUBLICATIONS

Kronenberg et al., Synchrotron FTIR imaging of OH in quartz mylonites, Solid Earth, Oct. 4, 2017, Center for Tectonophysics, Department of Geology and Geophysics, MS 3115, Texas A&M University, 21 pages.

METHODS AND APPARATUS FOR MEASURING EDGE RING TEMPERATURE

CROSS-REFERENCE TO RELATED APPLICATIONS

This application is a Continuation of and claims the benefit of U.S. patent application Ser. No. 16/707,945, filed Dec. 9, 2019 which is herein incorporated by reference in its entirety.

FIELD

Embodiments of the present principles generally relate to thermal acquisition in semiconductor manufacturing processes.

BACKGROUND

Semiconductor processes may use heating to bring a wafer up to a process temperature for various reasons. In some processes, the wafer is heated prior to coming into contact with components of a process chamber. Large mismatches in temperature between the wafer and the process chamber components may cause the wafer to undergo a thermal shock when the wafer is brought into contact with the components. The thermal shock may have undesirable effects on the wafer such as warping and/or causing the wafer to jump off of a holding surface. The inventors have found that bringing the chamber component and the wafer to a similar temperature may prevent or reduce the undesirable effects. However, measuring components used in a chamber with heating supplied by radiant lamps poses several challenges due to lamp radiation not only heating the wafer but also affecting temperature readings of chamber components.

Thus, the inventors have provided improved methods and apparatus to obtain temperatures of components used in semiconductor processing chambers.

SUMMARY

Methods and apparatus for obtaining thermal information of an internal assembly of a semiconductor processing chamber are provided herein.

In some embodiments, an apparatus for measuring a temperature of an assembly internal to a process chamber may comprise a lamp radiation filtering window configured to be positioned between a lamp radiation source and the assembly, a light pipe configured to be positioned between the lamp radiation filtering window and the assembly, the light pipe has a first end with a bevel configured to redirect infrared radiation emitted from the assembly through the light pipe and has a second end distal to the first end, an optical assembly configured to collimate, filter, and focus the infrared radiation from the second end of the light pipe, an optical detector configured to receive an output from the optical assembly and to generate at least one signal representative of the infrared radiation, and a temperature circuit that transforms the at least one signal into a temperature value.

In some embodiments, the apparatus may further include wherein the lamp radiation filtering window is made of a wet quartz material that absorbs radiation with a wavelength of approximately 2.7 microns to approximately 2.8 microns, wherein the light pipe is made of a sapphire material, wherein the light pipe is configured to be installed in the process chamber parallel to an upper surface of the assembly, wherein the bevel has an angle of approximately 45 degrees, a sheath configured to enclose the light pipe while providing an opening at the first end of the light pipe that is configured to allow infrared radiation into the light pipe, the sheath is configured with a purge channel that is configured to surround the light pipe and flow a purge gas to reduce contamination of the light pipe, a housing with liquid cooling channels that surrounds at least part of the light pipe and the optical assembly and configured to flow coolant to reduce background thermal emission, wherein the optical assembly includes a first aspherical condenser lens, an optical bandpass filter, and a second aspherical condenser lens, and/or wherein the optical assembly further includes a germanium lens with antireflective coating intervening between the first aspherical condenser lens and the second aspherical condenser lens.

In some embodiments, an apparatus for measuring a temperature of an assembly internal to a process chamber may comprise a light pipe configured to be positioned between a lamp radiation filtering window and the assembly, the light pipe has a first end with a bevel configured to redirect infrared radiation emitted from the assembly through the light pipe and has a second end distal to the first end, an optical assembly configured to collimate, filter, and focus the infrared radiation from the second end of the light pipe, an optical detector configured to receive an output from the optical assembly and to generate at least one signal representative of the infrared radiation, and a temperature circuit that transforms the at least one signal into a temperature value.

In some embodiments, the apparatus may further include wherein light pipe is configured to detect radiation from a surface of the assembly with a wavelength of approximately 2.7 microns to approximately 2.8 microns, wherein the light pipe is made of a sapphire material, wherein the light pipe is configured to be installed in the process chamber parallel to an upper surface of the assembly, wherein the bevel has an angle of approximately 45 degrees, a sheath configured to enclose the light pipe while providing an opening at the first end of the light pipe that is configured to allow infrared radiation into the light pipe, wherein the sheath is configured with a purge channel that is configured to surround the light pipe and flow a purge gas to reduce contamination of the light pipe, a housing that surrounds at least part of the light pipe and optical assembly, the housing has liquid cooling channels to flow coolant to reduce background thermal noise, wherein the optical assembly includes a first aspherical condenser lens, an optical bandpass filter, and a second aspherical condenser lens, and/or wherein the optical assembly further includes a germanium filter with antireflective coating.

In some embodiments, an apparatus for measuring a temperature of an assembly internal to a process chamber may comprise a light pipe configured to be positioned between a lamp radiation filtering window and the assembly, the light pipe has a first end with a bevel configured to redirect infrared radiation emitted from the assembly through the light pipe and has a second end distal to the first end, an optical assembly configured to collimate, filter, and focus the infrared radiation from the second end of the light pipe, an optical detector configured to receive an output from the optical assembly and to generate at least one signal representative of the infrared radiation, a temperature circuit that transforms the at least one signal into a temperature value; and a controller that is configured to receive the temperature value and to adjust one or more processes of a process chamber based on the temperature value.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
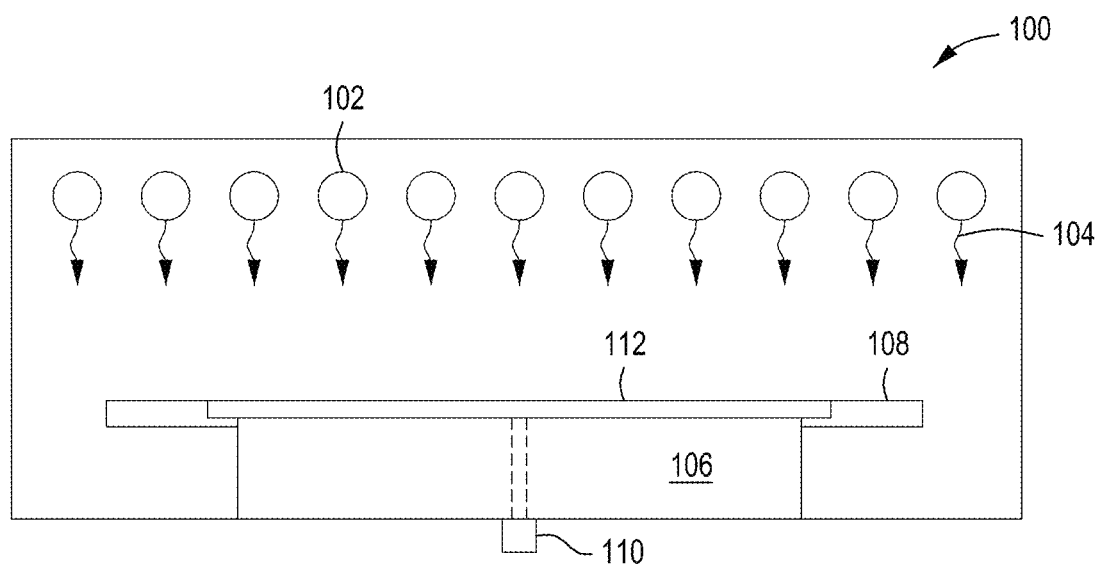
FIG. 1 depicts a cross-sectional view of a rapid thermal process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus allow measurements of internal process chamber assemblies such as, for example, edge rings during wafer preheating. The methods and apparatus advantageously minimize temperature mismatch, for example, between a wafer and an edge ring in, for example, rapid thermal process (RTP) chambers and the like. Reduction of temperature mismatches during processing may be utilized to beneficially provide a solution to the Wafer Out Of Pocket (WOOP) problem in RTP chambers. The methods and apparatus also provide a cost-effect way to retrofit existing chambers without requiring expensive and time-consuming chamber bottom modifications to the process chambers.

In some embodiments, a light pipe pyrometer assembly is used to gather infrared radiation from an internal assembly of a process chamber. The light pipe pyrometer assembly is completely immune to wafer and/or process kit leakage and may utilize existing process chamber viewports for an inexpensive and simple installation, eliminating the need for the expensive and time-consuming process chamber bottom modifications. The light pipe pyrometer assembly may also be used to facilitate in adjusting set points for feedback loops and assist in matching temperatures within process chambers. In some embodiments, the light pipe pyrometer assembly is used to measure edge ring temperatures of an RTP chamber such as the Radiance® Chambers manufactured by Applied Materials of Santa Clara, Calif. The upper face of the edge ring receives strong radiation from the heating lamps installed in the upper region of the process chamber. The lamp radiation can result in large errors in temperature measurements and/or pyrometer reading saturation. The methods and apparatus of the present principles provide a light pipe pyrometer assembly that is insensitive to lamp radiation and which may also be used to adjust a set-point for wafer preheating so the temperature of the wafer can be controlled and matched to that of the edge ring.

Figure 2:
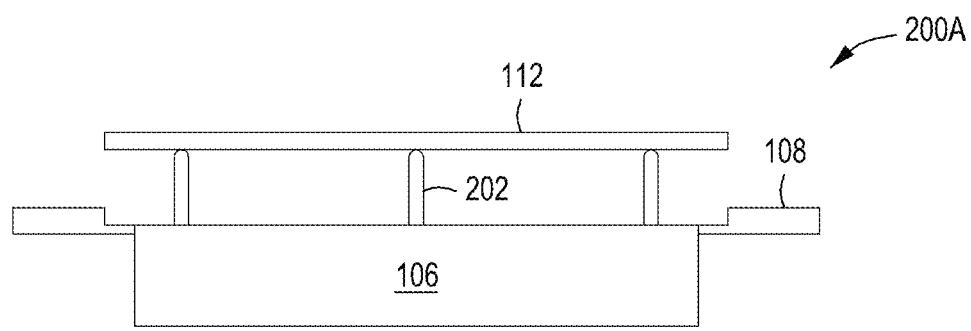
FIG. 2 depicts a cross-sectional view of a wafer out of pocket in accordance with some embodiments of the present principles.
Figure 2:
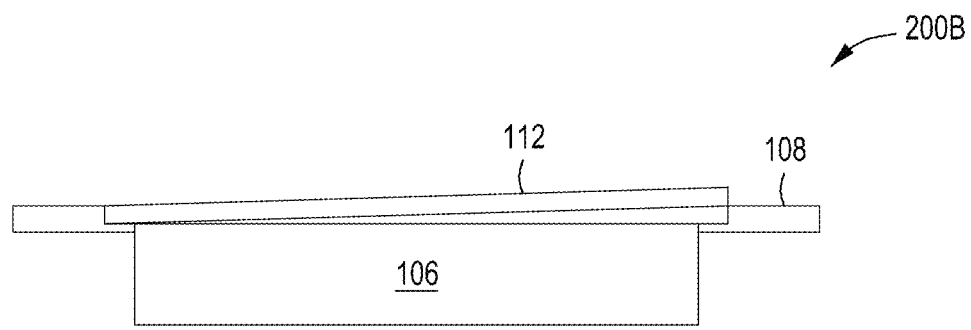

Although examples that follow utilize an RTP chamber and an edge ring, the methods and apparatus of the present principles are not limited to only RTP chambers and are not limited to only measuring edge ring temperatures. The methods and apparatus of the present principles may be utilized with other process chambers and other temperature measurements of assemblies internal to the process chambers. FIG. 1 depicts an RTP chamber 100 with heating lamps 102 that generate lamp radiation 104 towards a chamber body 106. The chamber body 106 includes an edge ring 108 and a wafer pyrometer 110. The wafer pyrometer 110 is used to determine the temperature of a wafer 112 from underneath the wafer 112. The wafer 112 and the edge ring 108 are exposed to the lamp radiation 104 from above. A cross-sectional view 200A of FIG. 2, illustrates a wafer 112 in a preheating condition where the wafer 112 has been lifted off of the edge ring 108 by lift pins 202. In cross-sectional view 200B of FIG. 2, the temperatures of the wafer 112 and the edge ring 108 are mismatched causing the wafer 112 to jump off of the edge ring 108 (a WOOP condition) when the wafer 112 is lowered onto the edge ring 108. The inventors have found that if the preheat temperature of the wafer 112 and the temperature of the edge ring 108 are similar, warping of the wafer 112 and WOOP conditions may be eliminated or reduced. If the temperature of the edge ring 108 is known during preheating of the wafer 112, the temperature of the edge ring 108 may be used as a set point for the preheating temperature of the wafer 112, eliminating the temperature mismatch.

Figure 3:
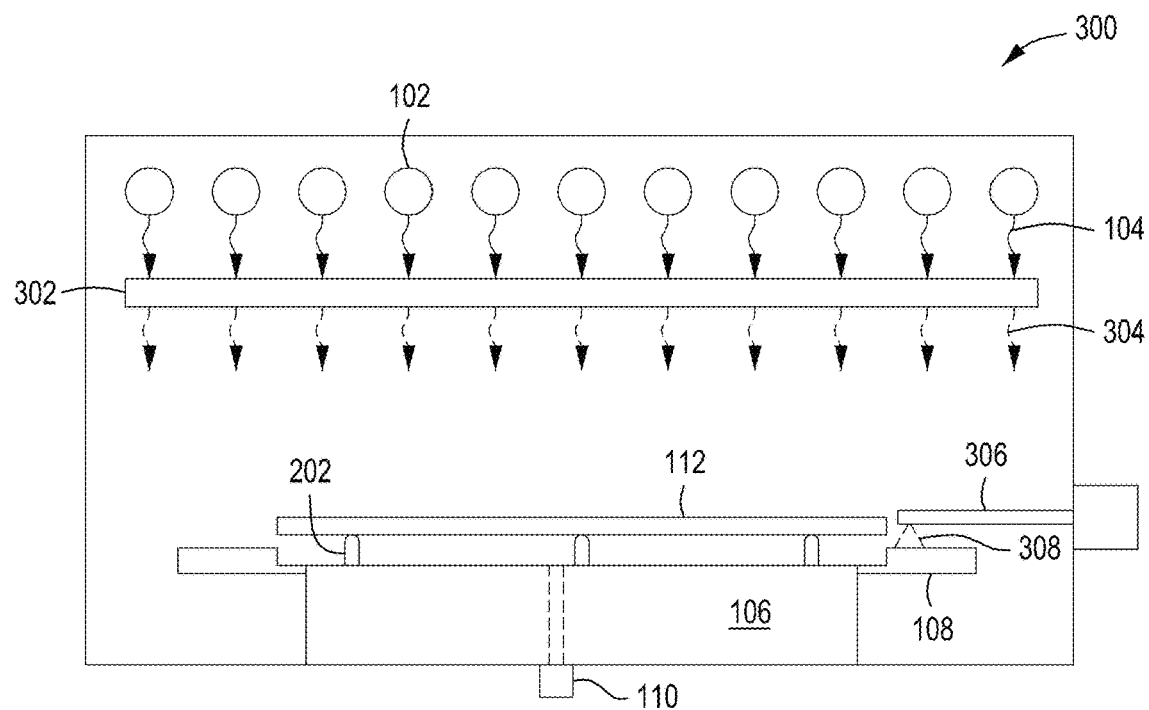
FIG. 3 depicts a cross-sectional view of a rapid thermal process chamber with a light pipe pyrometer assembly in accordance with some embodiments of the present principles.

FIG. 3 is a cross-sectional view of a process chamber 300 that includes some embodiments of the present principles. A lamp radiation filtering window 302 is positioned between the heating lamps 102 and the chamber body 106. The lamp radiation filtering window 302 blocks lamp radiation over a specific band of wavelengths, yielding a filtered lamp radiation 304. In some embodiments, the lamp radiation filtering window 302 may be made of a high OH content quartz or 'wet quartz' configured to block lamp radiation in a wavelength band of approximately 2.7 microns to approximately 2.8 microns. In some embodiments, the OH content of the quartz is approximately 1000 parts per million (ppm) or greater. In some embodiments, the OH content of the quartz is approximately 1000 ppm to approximately 1200 ppm. The inventors have found that the lamp radiation power loss in the filtered band has a low impact on usable heating power. The low impact is due to the lamp radiation power being concentrated in the shorter wavelength spectral range of which the filtered band only represents about 15% of the spectral emission peak of the lamp radiation and silicon wafer absorption is very low at the filtered band when the wafer is below approximately 500 degrees Celsius. A light pipe pyrometer assembly 306, sensitive to the blocked band of wavelengths, is positioned between the lamp radiation filtering window 302 and the edge ring 108. The light pipe pyrometer assembly 306 is insensitive to the filtered lamp radiation 304 used to heat the wafer 112 and detects edge ring radiation 308 in the filtered band of wavelengths. The inventors have found that by using a pyrometer that works in the filtered spectral range, the pyrometer will not be affected by lamp radiation in the temperature measurement.

Figure 4:
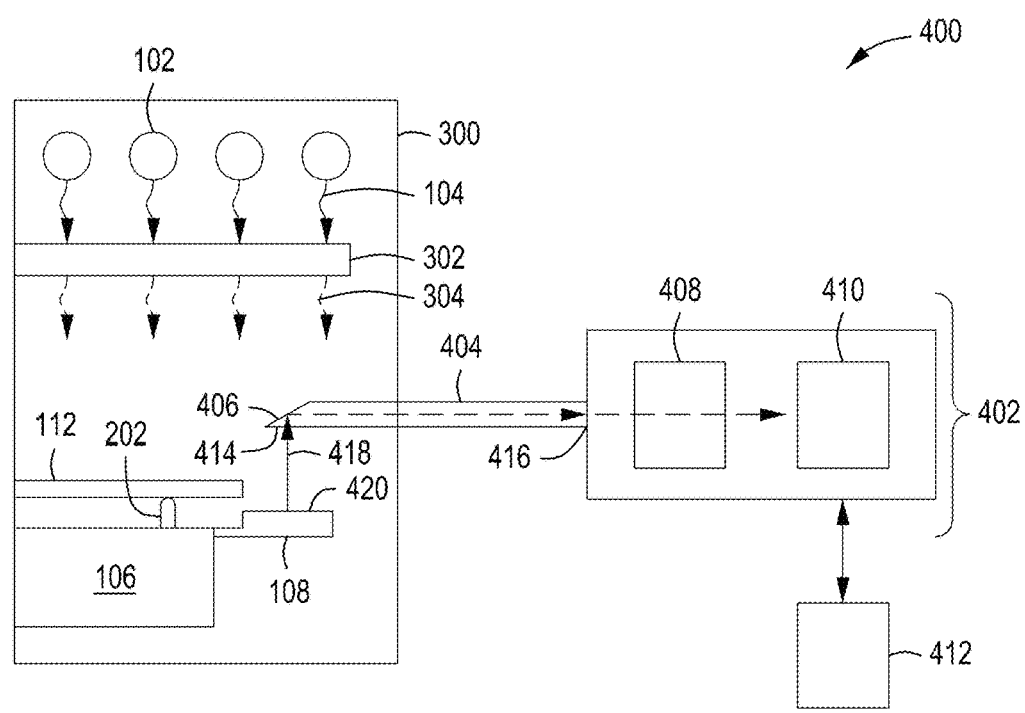
FIG. 4 depicts a cross-sectional view of a light pipe pyrometer assembly in accordance with some embodiments of the present principles.

FIG. 4 depicts a cross-sectional view 400 of a light pipe pyrometer assembly 402 in accordance with some embodiments. The light pipe pyrometer assembly 402 includes a light pipe 404, an optical assembly 408, and a detector assembly 410. The light pipe 404 includes a first end 414 with a bevel 406 and a second end 416, distal to the first end 414, that interfaces with the optical assembly 408. In some embodiments, the light pipe 404 may be a sapphire rod with a cut or beveled end. The beveled end is polished to internally reflect infrared radiation. In some embodiments, the bevel 406 is cut at an approximately 45 degree angle. In some embodiments, the light pipe 404 may have a diameter of approximately two millimeters. In some embodiments, the optical assembly 408 may include one or more aspherical condenser lenses and an optical bandpass filter (see, e.g., FIG. 5). The optical assembly 408 provides wavelength selection and minimizes background radiation. The optical assembly 408 interfaces with the detector assembly 410.

The detector assembly 410 converts optical information into at least one signal that can be received by a temperature processing circuit 412. The inventors have found that in order to use edge ring temperatures in feedback loops for wafer processing, the rate of detection has to be fast (e.g., approximately 100 Hz or higher). Most typical thermopile detectors are too slow for feedback processing uses. The inventors found that using photovoltaic detectors would allow for fast temperature acquisition. If a detector is selected to work in a filtered band of approximately 2.7 microns to approximately 2.8 microns, typical photovoltaic detectors such as silicon photodiodes or indium gallium arsenide (InGaAs) diodes are not suitable in the range of the filtered band. The inventors have found that uncooled indium arsenide antimonide (InAsSb) or indium arsenide (InAs) photovoltaic detectors can be used. InAsSb detectors are normally utilized in a range of approximately 3 microns to approximately 5 microns. Uncooled detectors allow for a simpler pyrometer design (compact, no power supply needed, etc.), but a cooled detector allows for a lower range of temperature detection. The InGaAs detectors may still have a satisfactory response range in the filtered band of approximately 2.7 microns to approximately 2.8 microns. InAs detectors have a spectral response of approximately 1 micron to approximately 3.5 microns. Pyroelectric detectors may also be utilized.

Figure 6:
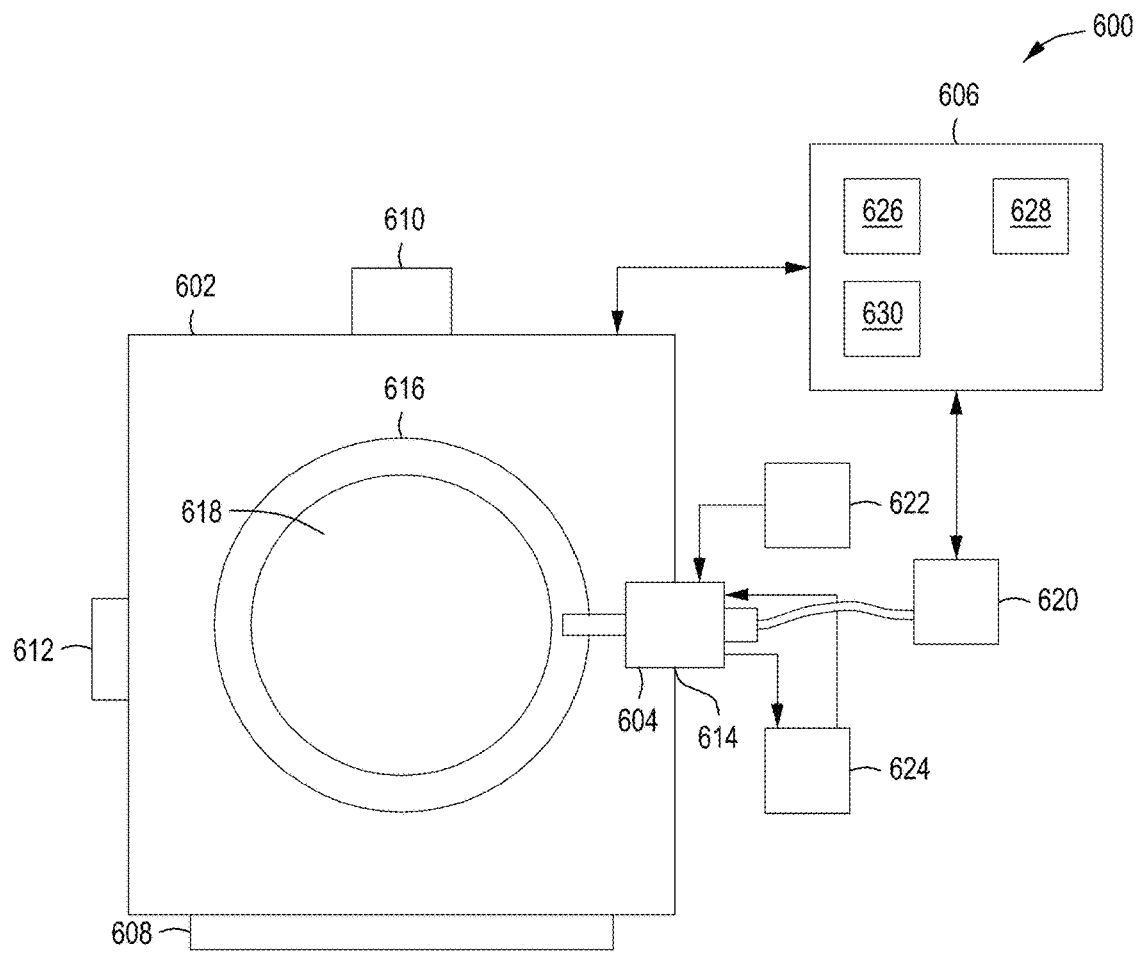
FIG. 6 depicts a top-down view of a rapid thermal process chamber with a light pipe pyrometer assembly interfacing with a controller in accordance with some embodiments of the present principles.

The temperature processing circuit 412 converts the at least one signal into a temperature value that may be utilized by a process controller (see, e.g., FIG. 6). The temperature processing circuit 412 may be part of the light pipe pyrometer assembly 402 and/or may be part of the controller 606 (see FIG. 6). Infrared radiation 418 from a surface 420 of the edge ring 108 is received by the first end 414 of the light pipe 404 and is reflected by the bevel 406 and redirected down a length of the light pipe 404 to the optical assembly 408 where the infrared radiation is collimated and filtered before being focused onto the detector assembly 410.

Figure 5:
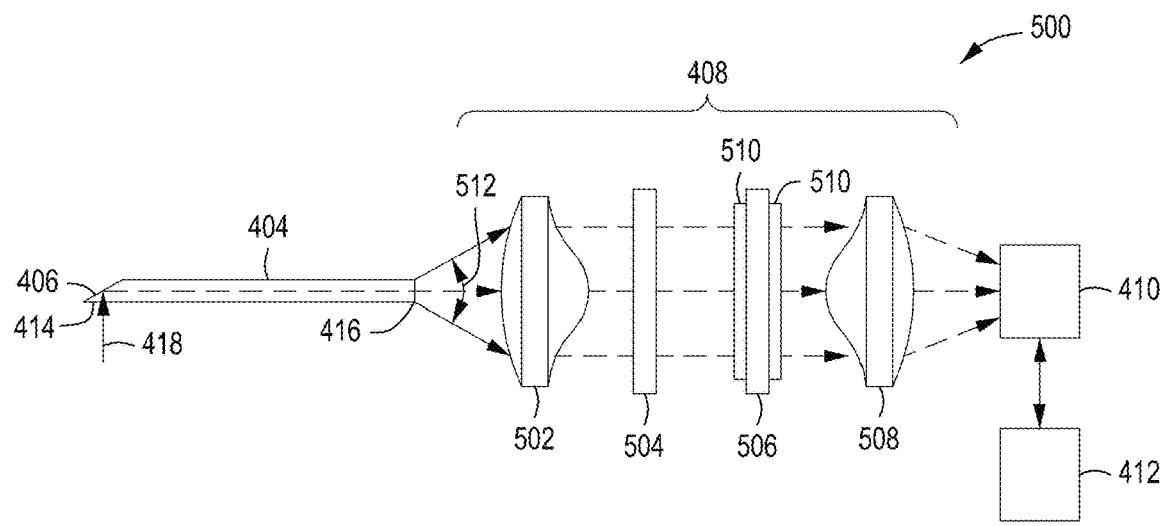
FIG. 5 depicts a side-view of an optical assembly in accordance with some embodiments of the present principles.

FIG. 5 depicts a side-view 500 of the optical assembly 408 in accordance with some embodiments. The infrared radiation 418 is directed down the light pipe 404 to the second end 416 of the light pipe 404 where the infrared radiation 418 diverges onto a first aspherical condenser lens 502. An aspherical condenser lens is used because the aspherical condenser lens collects more light than a normal lens, works with a wider divergent beam, and has a shorter focal length, allowing for a more compact design. The first aspherical condenser lens 502 may be made from sapphire or a molded material. The inventors have found that the parts inside a pyrometer always generate a small amount of thermal radiation due to the non-zero (Kelvin) ambient temperature which can be calculated by Planck's equation. The calculated values are equivalent to a significant amount of background radiation around the working wavelength, decreasing temperature accuracy. By using a lens material that is transparent over a spectrum range wider than the detector spectral range, the temperature accuracy may be increased.

The light pipe 404 has a wide acceptance angle and if coupled directly to the detector assembly 410, a significant band shift would occur in the bandpass filter due to a large cone angle 512 at the second end 416 of the light pipe 404. The first aspherical condenser lens 502 is used to collimate the widely divergent infrared radiation from the light pipe 404. The collimated infrared radiation sends the infrared radiation into an optical bandpass filter 504 at a non-varying incident angle, reducing shift and increasing the filtering accuracy of the optical bandpass filter 504. The first aspherical condenser lens 502 has a higher numerical aperture (NA) to enhance infrared radiation collection power. The optical bandpass filter 504 filters the infrared radiation 418 with minimal shift to a range of wavelengths. In some embodiments, the range of wavelengths passed by the optical bandpass filter 504 may be between approximately 2.7 microns and approximately 2.8 microns.

In some embodiments, an optional silicon or germanium filter 506 with an antireflective coating 510 may be used to further suppress background lamp radiation when an InAs type detector is used. The inventors have found that a bandpass filter doesn't have an ideal blocking of wavelengths outside of the bandpass region. Germanium has an absorption edge at approximately 1.6 microns to approximately 1.7 microns and silicon has an absorption edge of approximately 1.1 microns, meaning silicon will be opaque below 1.1 microns and germanium will be opaque below 1.6 to 1.7 microns. The optional silicon or germanium filter 506 can be used to further suppress unwanted lamp radiation wavelengths, further protecting the detector assembly 410. Silicon and germanium are highly reflective, causing significant light loss. The antireflective coating 510 reduces the reflections at the bandpass wavelengths (e.g., approximately 2.7 microns to approximately 2.8 microns). The infrared radiation 418 is then focused by a second aspherical condenser lens 508 onto the detector assembly 410. The second aspherical condenser lens 508 may be made from sapphire or a molded material. The inventors have found that for longer wavelength detectors, a housing with internally polished aluminum alloy can be used to reduce thermal radiation coming from the housing to provide increased temperature accuracy.

FIG. 6 depicts a top-down view 600 of an RTP chamber 602 with a light pipe pyrometer assembly 604 interfacing with a controller 606 in accordance with some embodiments. The RTP chamber 602 has a slit port 608 for inserting and removing a wafer 618, a gas exhaust port 610 for removing gases during wafer processing, a first viewport 612 used for viewing the wafer 618, and a second viewport 614 that has been converted for use with a light pipe pyrometer assembly 604. The light pipe pyrometer assembly 604 can be easily retrofitted into the second viewport 614. The light pipe pyrometer assembly 604 does not require expensive chamber bottom modifications to read the temperature of the edge ring 616. The light pipe pyrometer assembly 604 may interface with the controller 606 through a temperature processing circuit 620 and/or may interface with the controller 606 directly (not shown). In some embodiments, the light pipe pyrometer assembly 604 may also interface with a purge gas supply 622 that supplies a purge gas to flush contaminants from around the light pipe. In some embodiments, the light pipe pyrometer assembly 604 may also interface with a liquid coolant supply 624 to assist in reducing thermal stray radiation from the light pipe pyrometer assembly 604 that interferes with the light pipe transmission of infrared radiation. In some embodiments, the liquid coolant may be water and the like.

The controller 606 controls the operation of the RTP chamber 602 using a direct control of the RTP chamber or alternatively, by controlling remote computers (or controllers) associated with the RTP chamber 602. In operation, the controller 606 enables data collection and feedback from the RTP chamber 602 and/or other systems to optimize performance of the RTP chamber 602. The controller 606 generally includes a Central Processing Unit (CPU) 626, a memory 628, and a support circuit 630. The CPU 626 may be any form of a general-purpose computer processor that can be used in an industrial setting. The support circuit 630 is conventionally coupled to the CPU 626 and may comprise a cache, clock circuits, input/output subsystems, power supplies, and the like. Software routines, such as a method as described above may be stored in the memory 628 and, when executed by the CPU 626, transform the CPU 626 into a specific purpose computer (controller 606). The software routines may also be stored and/or executed by a second controller (not shown) that is located remotely from the RTP chamber 602.

The memory 628 is in the form of computer-readable storage media that contains instructions, when executed by the CPU 626, to facilitate the operation of the semiconductor processes and equipment. The instructions in the memory 628 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 7:
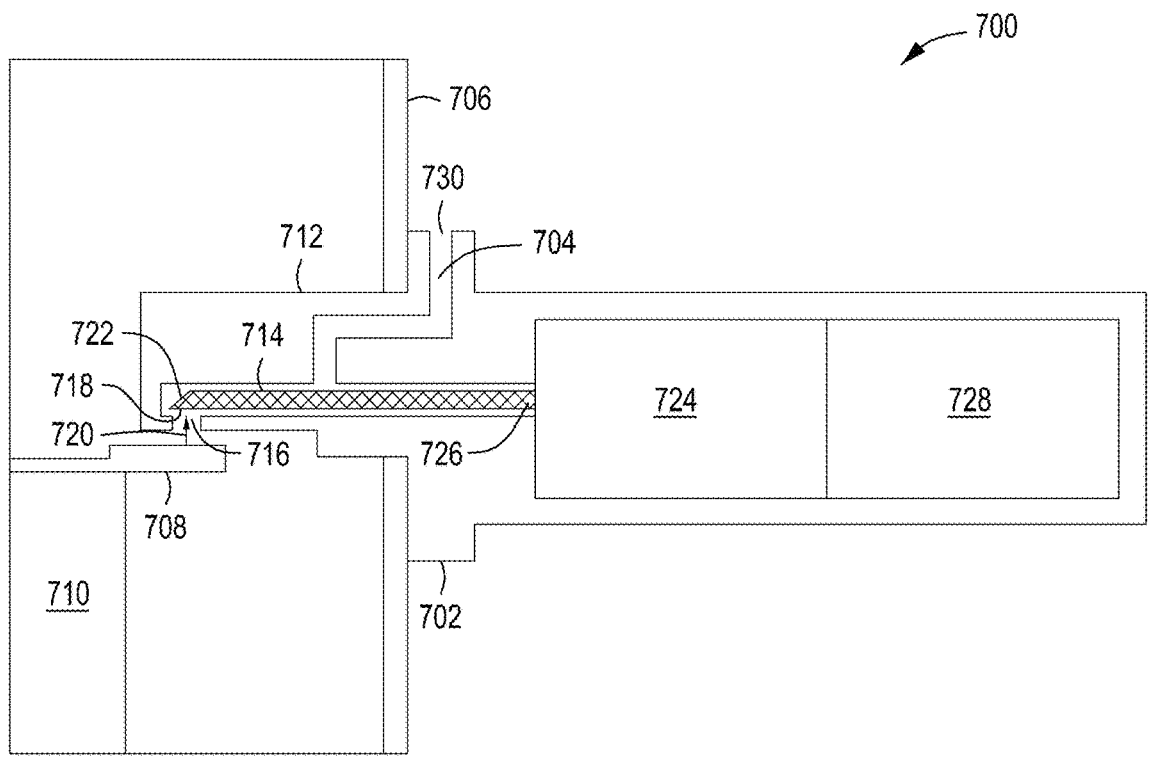
FIG. 7 is a cross-sectional view of a light pipe pyrometer assembly with a purge gas channel in accordance with some embodiments of the present principles.

In order to have good accuracy in temperature measurement, the inventors have found that the light pipe has to be kept clean. In certain applications, outgassing may occur that results in deposition on the light pipe surface which affects the temperature measurement. The inventors discovered that by using a closed-end sheath with a small opening on a bottom side of the sheath for receiving infrared radiation, the light pipe can be purged with a purge gas to keep the light pipe clean during use. FIG. 7 is a cross-sectional view 700 of a light pipe pyrometer assembly 702 with a purge gas channel 704 with a purge gas port 730 in a sheath 712 surrounding a light pipe 714 in accordance with some embodiments. In some embodiments, the sheath 712 is formed of an aluminum alloy such as, for example, 6061 and the like. After machining, the sheath 712 is carefully handled to avoid damaging a protective native oxide layer that forms on the surface of the sheath 712. The exterior surface of the sheath 712 is then masked while the interior surfaces are hard anodized. The exterior surface has low emissivity, so the heat absorption is low. The interior surfaces have lower reflectance, so the background stray radiation is reduced, yielding increased temperature accuracy.

In some embodiments, the light pipe pyrometer assembly 702 is retrofitted into a viewport of an RTP chamber 706 and configured to extend over an edge ring 708 on a chamber body assembly 710. The sheath 712 includes an opening 716 to allow infrared radiation 720 from the edge ring 708 to reach a first end 718 of the light pipe 714. The sheath 712 covers the first end 718 of the light pipe 714 and precludes forward light leakage into the light pipe 714, increasing the accuracy of the temperature measurement. A bevel 722 on the first end 718 of the light pipe 714 redirects the infrared radiation 720 to an optical assembly 724 at a second end 726 of the light pipe 714, distal to the first end 718 of the light pipe 714. The infrared radiation 720 then passes from the optical assembly 724 to a detector assembly 728. The detector assembly 728 then sends at least one signal representative of the infrared radiation 720 to a temperature process circuit (not shown, see, e.g., FIG. 4, temperature processing circuit 412 and FIG. 6, temperature processing circuit 620). In some embodiments, the purge gas channel 704 extends from the purge gas port 730 to the opening 716 at the first end 718 of the light pipe 714. In some embodiments, the purge gas channel 704 extends to fully encompass an entire length of the light pipe 714 from the first end 718 to the second end 726. The purge gas channel 704 allows a purge gas, for example, an inert gas such as, but not limited to, dry nitrogen and the like to flow over the light pipe 714 to assist in removing contaminants from around the light pipe 714 that would reduce the accuracy of the light pipe pyrometer assembly 702.

Figure 8:
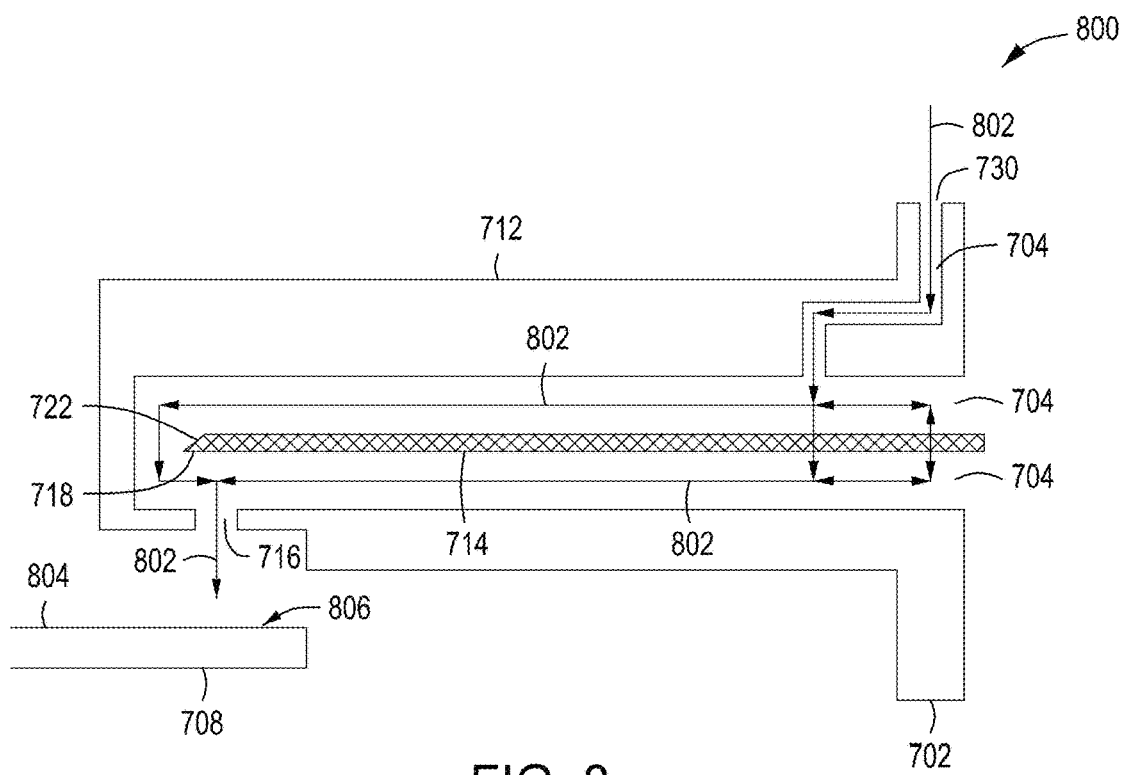
FIG. 8 is a cross-sectional view of a light pipe pyrometer assembly illustrating purge gas flow in accordance with some embodiments of the present principles.

FIG. 8 is a cross-sectional view 800 of the light pipe pyrometer assembly 702 illustrating a purge gas flow 802 in accordance with some embodiments. As the purge gas enters the purge gas port 730, the purge gas flows through the purge gas channel 740 and around the light pipe 714 and then out through the opening 716 and into the RTP chamber (not shown). The purge gas flow 802 may cause a slight temperature drop on a portion 806 of a surface 804 of the edge ring 708 upon exiting the opening 716 of the sheath 712. In some embodiments, the edge ring 708 is rotating so the cooling effect on the edge ring 708 is minimal and not localized. The purge gas flow 802 is kept at a low sccm (standard cubic centimeters per minute) rate such as, for example, approximately 10 to approximately 1000 to reduce any unwanted cooling effects on the edge ring 708.

Figure 9:
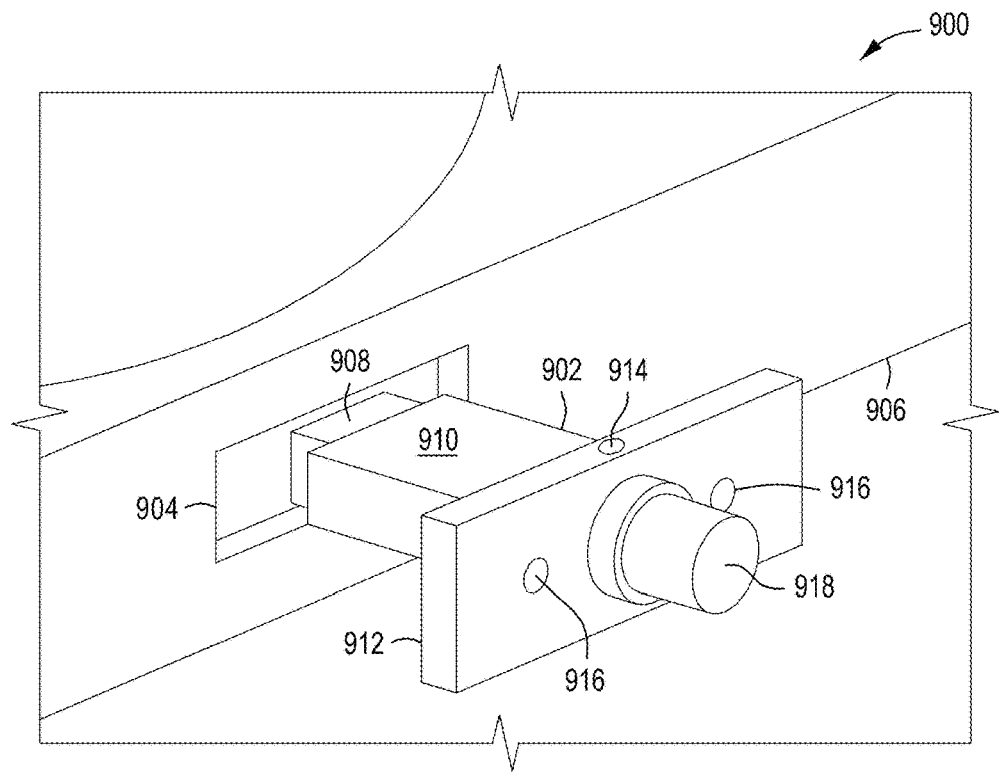
FIG. 9 is an isometric view of a light pipe pyrometer assembly for a view port in accordance with some embodiments of the present principles.
Figure 10:
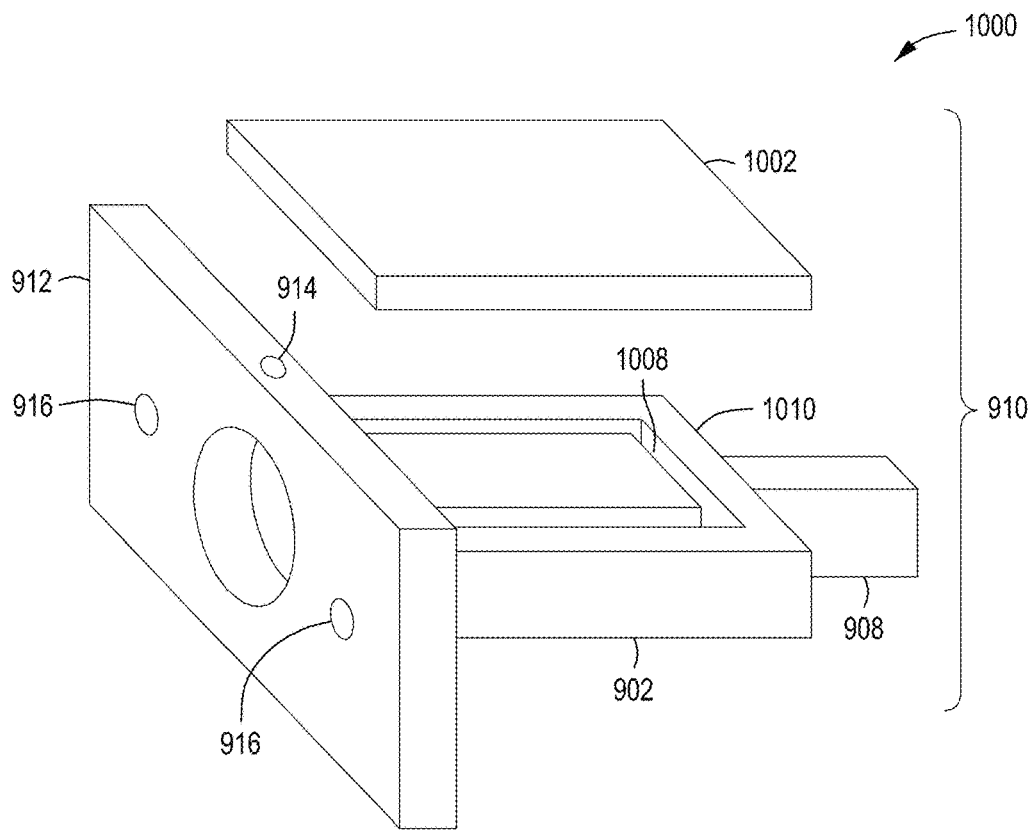
FIG. 10 is an isometric view of a light pipe pyrometer assembly with a cooling channel in accordance with some embodiments of the present principles.

FIG. 9 is an isometric view 900 of a light pipe pyrometer assembly 902 for a viewport 904 of an RTP chamber assembly 906 in accordance with some embodiments. The light pipe pyrometer assembly 902 has a sheath extension 908 that houses the light pipe, purge gas channel, and the opening for expelling purge gas and also for receiving infrared radiation from an edge ring. A sheath main body 910 further encompasses the light pipe and purge channel to distribute a purge gas from a purge gas port 914 in a flange 912. The sheath main body 910 may also provide internal cooling channels to cool the light pipe pyrometer assembly 902 with liquid cooling supplied at the coolant ports 916 in the flange 912. The light pipe pyrometer assembly 902 includes a connection point 918 to allow the light pipe pyrometer assembly 902 to interface with other components to relay temperature information received from the edge ring. FIG. 10 is an isometric view 1000 of the light pipe pyrometer assembly 902 with a coolant channel 1008 in accordance with some embodiments. In some embodiments, the coolant channel 1008 may be formed in a lower portion 1010 of the sheath main body 910 along with a first purge gas channel portion 1006. An upper portion 1002 of the sheath main body 910 provides a cover to the lower portion 1010 to seal the coolant channel 1008.

Figure 11:
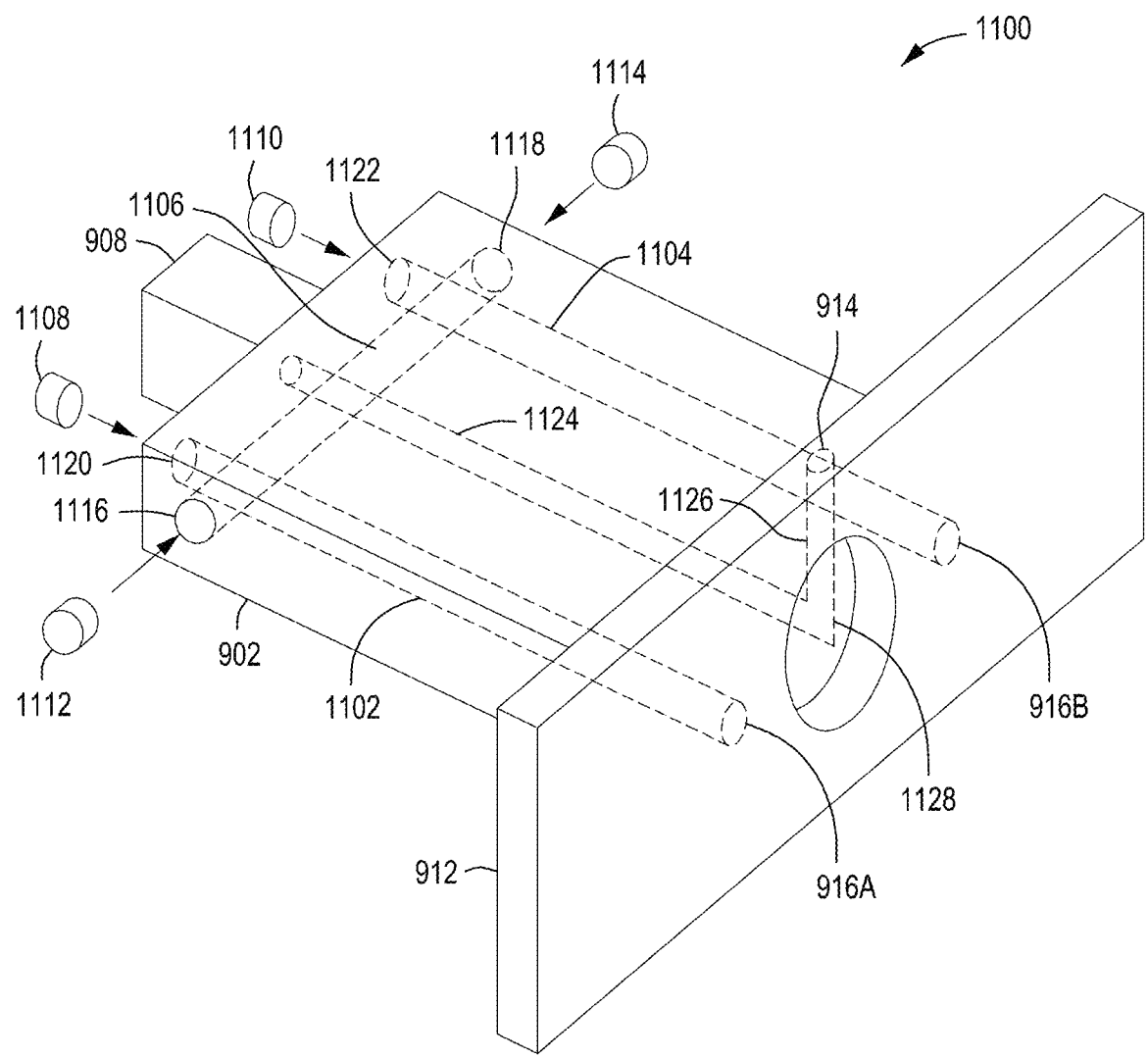
FIG. 11 is an isometric view of a light pipe pyrometer assembly with cooling channels in accordance with some embodiments of the present principles.

FIG. 11 is an isometric view 1100 of a light pipe pyrometer assembly 902 with a first coolant channel 1102, a second coolant channel 1104, and a third coolant channel 1106 in accordance with some embodiments. In some embodiments, the first coolant channel 1102 and the second coolant channel 1104 may be formed by drilling longitudinally through the sheath main body 910 and through the flange 912, creating longitudinal coolant channels that connect to the coolant ports 916 in the flange 912. The third coolant channel 1106 is formed by drilling through the sheath main body 910 perpendicular to the first coolant channel 1102 and the second coolant channel 1104 such that the third coolant channel 1106 intersects with the first coolant channel 1102 and the second coolant channel 1104 to form a single coolant path between the coolant ports 916A, 916B. A first plug 1108 is inserted into an end 1120 of the first coolant channel 1102 distal to the coolant port 916A. A second plug 1110 is inserted into an end 1122 of the second coolant channel 1104 distal to the coolant port 916B. A third plug 1112 is inserted into a first end 1116 of the third coolant channel 1106 and a fourth plug 1114 is inserted into a second end 1118 of the third coolant channel 1106. A first portion 1126 of a purge gas channel is formed by drilling vertically through a portion of the flange 912. A second portion 1124 of the purge gas channel is formed by drilling horizontally through the sheath main body 910 until the second portion 1124 intersects with an end 1128 of the first portion 1126 distal to the purge gas port 914.

Figure 12:
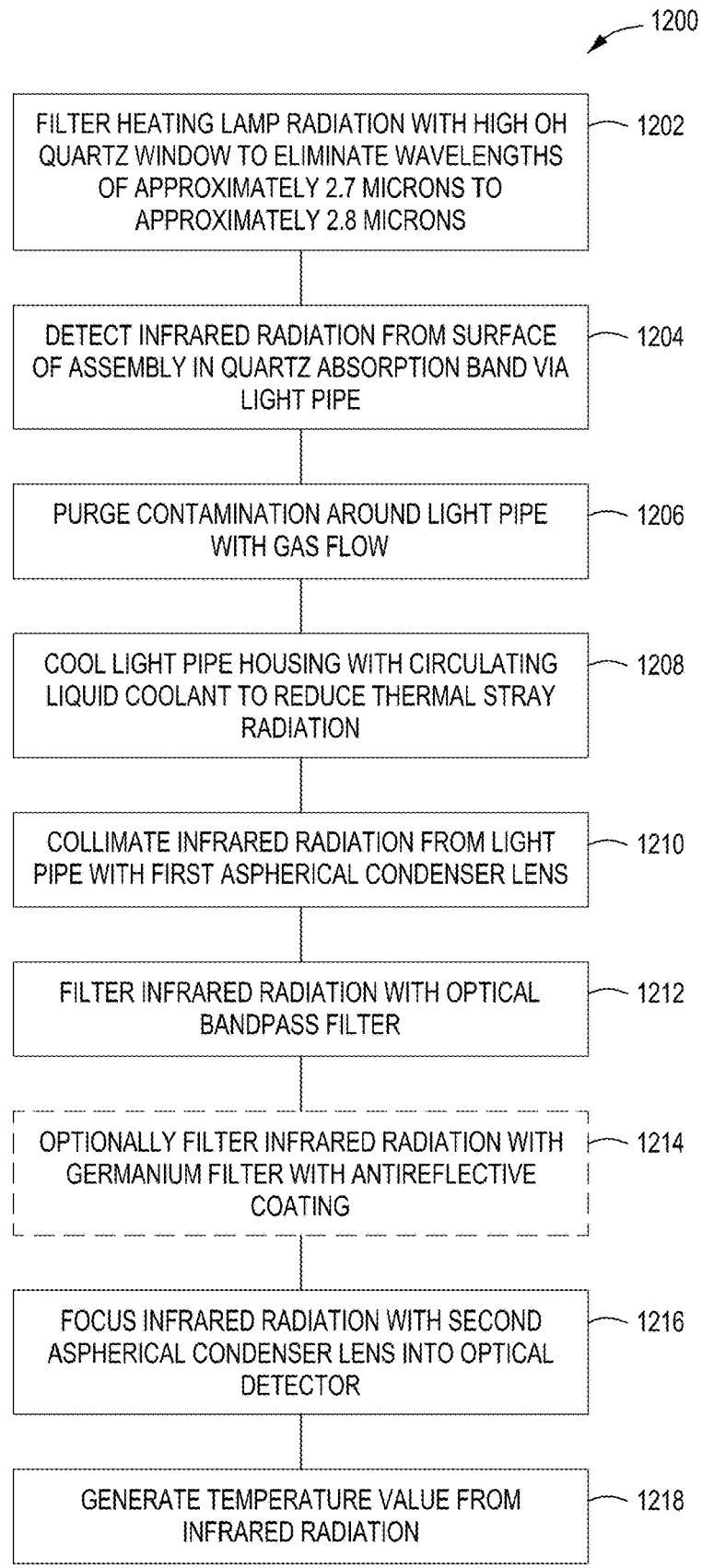
FIG. 12 is a method of detecting temperatures of an assembly in a processing chamber in accordance with some embodiments of the present principles.

FIG. 12 is a method 1200 of detecting temperatures of an assembly in a processing chamber in accordance with some embodiments. In bock 1202, lamp radiation is filtered to block wavelengths of approximately 2.7 microns to approximately 2.8 microns. In some embodiments, wet quartz with an OH content of approximately 1000 ppm to approximately 1200 ppm or greater may be used to filter the lamp radiation. In block 1204, infrared radiation is detected from the surface of an assembly internal to the processing chamber in a quartz absorption band via a light pipe. In some embodiments, the light pipe is made from sapphire. In some embodiments, the infrared radiation is detected by a light pipe that is covered with a sheath with an open end that allows infrared radiation to be detected by the light pipe. In some embodiments, the light pipe may have a bevel at one end that redirects the infrared radiation down a length of the light pipe. In block 1206, contaminants around the light pipe are removed by flowing a purge gas over and around the light pipe during absorption of the infrared radiation from the assembly. In block 1208, a light pipe housing is cooled with liquid coolant to facilitate in reducing thermal stray radiation caused by thermal radiation from the light pipe housing. In block 1210, the infrared radiation from the light pipe is collimated using a first aspherical condenser lens. In some embodiments the first aspherical condenser lens may be made from sapphire or from a molded material. In block 1212, the infrared radiation is then filtered with an optical bandpass filter. In some embodiments, the optical bandpass filter passes wavelengths from approximately 2.7 microns to approximately 2.8 microns. In block 1214, optionally, the infrared radiation is filtered by using a germanium filter with an antireflective coating to further filter unwanted wavelengths. In block 1216, the infrared radiation is focused onto an optical detector with a second aspherical condenser lens. In some embodiments, the second aspherical condenser lens may be made from sapphire or from a molded material. In block 1218, a temperature value is generated from the infrared radiation. In some embodiments, the optical detector may convert the infrared radiation into at least one signal representative of the infrared radiation. The at least one signal may then be processed by a temperature processing circuit to convert the at least one signal into a temperature value. The temperature value may then passed to a controller for use in controlling a process in the processing chamber and the like.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for measuring a temperature internal to a process chamber, comprising:
    a lamp radiation filtering window configured to be positioned between a lamp radiation source and a light pipe, wherein the lamp radiation filtering window, the lamp radiation source, and the light pipe are internal to the process chamber;
    the light pipe having a first end with a bevel configured to redirect infrared radiation through the light pipe and having a second end distal to the first end;
    an optical assembly configured to collimate, filter, and focus the infrared radiation from the second end of the light pipe;
    an optical detector configured to receive an output from the optical assembly and to generate at least one signal representative of the infrared radiation; and a temperature circuit that transforms the at least one signal into a temperature value.

2. The apparatus of claim 1, wherein the light pipe is made of a sapphire material.

3. The apparatus of claim 1, wherein the bevel has an angle of approximately 45 degrees.

4. The apparatus of claim 1, further comprising:
a sheath configured to enclose the light pipe while providing an opening at the first end of the light pipe that is configured to allow infrared radiation into the light pipe, the sheath is configured with a purge channel that is configured to surround the light pipe and flow a purge gas to reduce contamination of the light pipe.

5. The apparatus of claim 1, further comprising:
a housing with liquid cooling channels that surrounds at least part of the light pipe and the optical assembly and configured to flow coolant to reduce background thermal emission.

6. The apparatus of claim 1, wherein the lamp radiation filtering window is made of a wet quartz material that absorbs radiation with a wavelength of approximately 2.7 microns to approximately 2.8 microns.

7. The apparatus of claim 6, wherein the wet quartz has an OH content of approximately 1000 parts per million (ppm) to approximately 1200 ppm.

8. The apparatus of claim 1, wherein the optical assembly includes a first aspherical condenser lens, an optical bandpass filter, and a second aspherical condenser lens.

9. The apparatus of claim 8, wherein the optical assembly further includes a germanium lens with antireflective coating intervening between the first aspherical condenser lens and the second aspherical condenser lens.

10. An apparatus for measuring a temperature internal to a process chamber, comprising:
a light pipe configured to be positioned internally in the process chamber with a lamp radiation filtering window internal to the process chamber positioned between the light pipe and a lamp radiation source internal to the process chamber, the light pipe having a first end with a bevel configured to redirect infrared radiation through the light pipe and having a second end distal to the first end;
an optical assembly configured to collimate, filter, and focus the infrared radiation from the second end of the light pipe;
an optical detector configured to receive an output from the optical assembly and to generate at least one signal representative of the infrared radiation; and
a temperature circuit that transforms the at least one signal into a temperature value.

11. The apparatus of claim 10, wherein light pipe is configured to detect radiation with a wavelength of approximately 2.7 microns to approximately 2.8 microns.

12. The apparatus of claim 10, wherein the light pipe is made of a sapphire material.

13. The apparatus of claim 10, wherein the light pipe has a diameter of approximately 2 millimeters.

14. The apparatus of claim 10, wherein the bevel has an angle of approximately 45 degrees.

15. The apparatus of claim 10, wherein the optical assembly includes a first aspherical condenser lens, an optical bandpass filter, and a second aspherical condenser lens.

16. The apparatus of claim 15, wherein the optical assembly further includes a germanium filter with antireflective coating.

17. The apparatus of claim 10, further comprising:
a sheath configured to enclose the light pipe while providing an opening at the first end of the light pipe that is configured to allow infrared radiation into the light pipe.

18. The apparatus of claim 17, wherein the sheath is configured with a purge channel that is configured to surround the light pipe and flow a purge gas to reduce contamination of the light pipe.

19. The apparatus of claim 18, further comprising:
a housing that surrounds at least part of the light pipe and optical assembly, the housing having liquid cooling channels to flow coolant to reduce background thermal noise.

20. An apparatus for measuring a temperature internal to a process chamber, comprising:
a light pipe configured to be positioned internally in the process chamber with a lamp radiation filtering window internal to the process chamber positioned between the light pipe and a lamp radiation source internal to the process chamber, the light pipe having a first end with a bevel configured to redirect infrared radiation through the light pipe and having a second end distal to the first end;
an optical assembly configured to collimate, filter, and focus the infrared radiation from the second end of the light pipe;
an optical detector configured to receive an output from the optical assembly and to generate at least one signal representative of the infrared radiation;
a temperature circuit that transforms the at least one signal into a temperature value; and
a controller that is configured to receive the temperature value and to adjust one or more processes of the process chamber based on the temperature value.

* * * * *